United States Patent
Su et al.

(10) Patent No.: US 7,754,509 B2
(45) Date of Patent: Jul. 13, 2010

(54) MANUFACTURING METHOD FOR THIN FILM TRANSISTOR

(75) Inventors: Ta-Jung Su, Padeh (TW); Chin-Tzu Kao, Padeh (TW); Chia-Che Hsu, Padeh (TW)

(73) Assignee: Chunghua Picture Tubes, Ltd., Padeh, Taoyuan (TW)

( * ) Notice: Subject to any disclaimer, the term of this patent is extended or adjusted under 35 U.S.C. 154(b) by 244 days.

(21) Appl. No.: 11/393,436

(22) Filed: Mar. 29, 2006

(65) Prior Publication Data

US 2007/0238228 A1 Oct. 11, 2007

(51) Int. Cl.
*H01L 21/00* (2006.01)

(52) U.S. Cl. ................... 438/30; 257/E21.414

(58) Field of Classification Search ............. 438/151, 438/158, 30, 34, 159; 257/E21.414, 295
See application file for complete search history.

(56) References Cited

U.S. PATENT DOCUMENTS

| | | | | |
|---|---|---|---|---|
| 5,825,050 | A * | 10/1998 | Hirakawa | 257/57 |
| 5,856,013 | A * | 1/1999 | Abkowitz et al. | 428/412 |
| 6,444,505 | B1 * | 9/2002 | Chen et al. | 438/149 |
| 6,635,881 | B2 | 10/2003 | Yamada et al. | |
| 6,876,428 | B2 * | 4/2005 | Kwak et al. | 349/187 |
| 6,911,669 | B2 * | 6/2005 | Lai | 257/59 |
| 7,049,163 | B1 * | 5/2006 | Kao et al. | 438/30 |
| 2002/0003589 | A1 * | 1/2002 | Watanabe et al. | 349/43 |
| 2003/0116764 | A1 * | 6/2003 | Fujikawa et al. | 257/57 |
| 2003/0160237 | A1 * | 8/2003 | Kawachi et al. | 257/59 |
| 2004/0100596 | A1 * | 5/2004 | Lan et al. | 349/110 |
| 2006/0163578 | A1 * | 7/2006 | Fujikawa et al. | 257/59 |
| 2007/0004101 | A1 * | 1/2007 | Lim | 438/149 |
| 2007/0218601 | A1 * | 9/2007 | Seo et al. | 438/151 |

OTHER PUBLICATIONS

Ruzyllo, Jerzy, Semiconductor Glossary, An Introduction to Semiconductor Terminology, pp. 103, 1st edition (Jan. 2004).*

* cited by examiner

*Primary Examiner*—W. David Coleman
*Assistant Examiner*—Latanya Crawford
(74) *Attorney, Agent, or Firm*—Apex Juris, pllc; Tracy M Heims

(57) ABSTRACT

A manufacturing method for a thin film transistor (TFT) is provided. In the manufactured TFT, after a source structure, a drain structure and a channel structure are formed, a first photoresist layer is not removed and a second photoresist is formed on the first photoresist layer through which a semiconductor structure is formed. Further, n-type amorphous silicon, poly silicon or an organic metallic compound is used in replace of the conventional metal to form the source and drain structures so as to reduce step number of manufacturing for the TFT.

13 Claims, 8 Drawing Sheets

US 7,754,509 B2

MANUFACTURING METHOD FOR THIN FILM TRANSISTOR

BACKGROUND OF THE INVENTION

1. Field of the Invention

The present invention relates to a manufacturing method for a transistor and particularly to a manufacturing method for a thin film transistor (TFT).

2. Descriptions of the Related Art

With development of the current technology, displays have been fabricated with an increasingly slighter weight and compacter volume. Although traditional cathode ray tubes have their advantages, they are heavy in volume and power consuming. In this regard, liquid crystal displays (LCDs), plasma displays and electroluminescence (EL) displays have become the mainstreamed displays on the market. Among them, the LCD is the most competitive since it provides the advantages of a lower operating voltage and being radiating ray free, slight in weight and small in volume.

In manufacturing of a LCD, a microphotography process is a critical and the most precision demanding step and costs the most, particularly an array process therein since numerous TFTs are required to be formed on a single substrate at same time. Therefore, reduction of step number in the manufacturing of the TFT may improve yield of the LCD and reduce cost therefor in efficiency.

FIG. 1A to FIG. 1G show sectional views of a TFT fabricated by a prior manufacturing method after each step is performed, respectively. Now referring to FIG. 1, a substrate 11 is first provided, which may be a glass substrate. Next, a first metal layer 12 is formed on the substrate 11. Then, a gate structure 12a is defined on the metal layer 12 by using a first photomask (not shown) and subsequently formed through an etching process. Referring to FIG. 1B, a first insulative layer 13 is formed on the gate structure 12a and the substrate 11. Referring to FIG. 1C, a semiconductor layer 15 is formed on the first insulative layer 13. Then, an n-type semiconductor layer 15a is formed on a surface of the semiconductor layer 15 through a doping process. Thereafter, a second photomask (not shown) is used to define a semiconductor structure 15b and then the semiconductor layer 15 and the n-type semiconductor layer 15a are etched to form the semiconductor 15b. Referring to FIG. 1D, a second metal layer 16 is formed on the semiconductor structure 15b and the first insulative layer 13. Then, a third photomask (not shown) is used to define a source structure 16a and a drain structure 16b and the second metal layer 16 is etched to form the source and drain structures 16a,16b. Referring to FIG. 1E, the third photomask is now taken as a mask to etch the n-type semiconductor layer 15a so as to form a channel structure 15c. Referring to FIG. 1F, a second insulative layer 17 is formed on the source and drain structures 16a, 16b, the channel structure 15c and the first insulative layer 13. Then, a fourth photomask (not shown) is used to define a contact window structure 17a and the second insulative layer 17 is etched to form the contact structure 17a. Referring to FIG. 1G, a transparent metal layer 18 is formed on the drain structure 16b and the second insulative layer 17. Then, a fifth photomask (not shown) is used to define a pixel electrode structure 18a and the transparent metal layer 18 is etched to form the pixel electrode structure 18a.

Referring to FIG. 2, a flowchart illustrating a conventional manufacturing method for the TFT structure corresponding to FIG. 1A through FIG. 1G is shown therein. At first, provide a substrate having a gate structure with a first insulative layer formed on the gate structure and the substrate (S20), wherein the gate structure is formed by etching a first metal layer. Next, form a semiconductor layer and an n-type semiconductor layer on the first insulative layer (S21). Thereafter, form a first photoresist layer on the semiconductor layer and the n-type semiconductor layer (S22). Then, etch the semiconductor layer and the n-type semiconductor layer to form a semiconductor structure (S23). Next, remove the first photoresist layer (S24). Then, form a second metal layer on the semiconductor structure and the first insulative layer (S25). Thereafter, form a second photoresist layer on the second metal layer (S26). Subsequently, etch the second metal layer to form a source structure and a drain structure (S27). Then, etch the n-type semiconductor layer to form a channel structure (S28). Finally, remove the second photoresist layer (S29).

Since reduction of manufacturing step number may efficiently lead to a higher yield of the array manufacturing process and a lower cost therefor, the reduction issue is considered a very important matter in the LCD manufacturing field.

SUMMARY OF THE INVENTION

It is an object of the present invention to reduce step number of manufacturing for a thin film transistor (TFT) so as to improve manufacturing yield of an array process in the manufacturing process and lower a cost for the manufacturing process.

To achieve the above objects, the manufacturing method for a TFT comprises the steps of providing a substrate having a gate structure thereon with a first insulative layer on the gate structure and the substrate, forming a semiconductor layer and an ohmic contact layer on the first insulative layer, forming a first photoresist layer on the ohmic contact layer, etching the semiconductor layer and the ohmic contact layer to form a source structure and a drain structure on the ohmic contact layer and a channel structure on the semiconductor layer, forming a second photoresist layer on the first photoresist layer and the semiconductor layer, etching the semiconductor layer to form a semiconductor structure and removing the first and second photoresist layers.

According to the manufacturing method for a TFT, the first photoresist layer is not removed after the source and drain structures and the channel structure are formed but otherwise formed above with the second photoresist layer so that the semiconductor structure is formed. Further, the source and drain structures are made of n-type amorphous silicon (a-Si), poly silicon (P—Si) or an organic metallic compound in replace of the priory used metal. As such, step number required for the manufacturing for the TFT is reduced and thus manufacturing yield of the TFT is improved and manufacturing cost therefor is lowered.

Other objects, features and advantages will become apparent after the description through the preferred embodiment below, with reference to the accompanying drawings, is read.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1A:
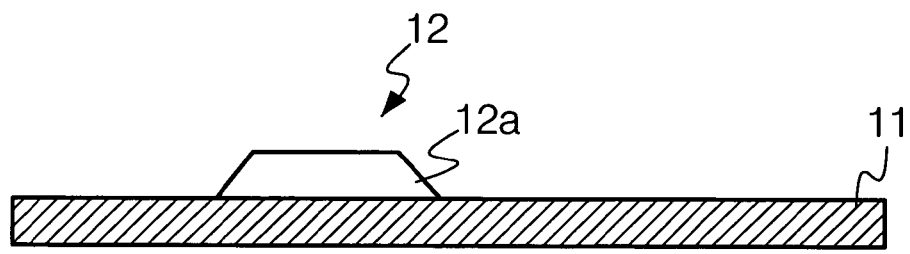
FIG. 1A to FIG. 1G show sectional views of a thin film transistor (TFT) structure fabricated by a conventional manufacturing process, respectively, after each step is performed.
Figure 1B:
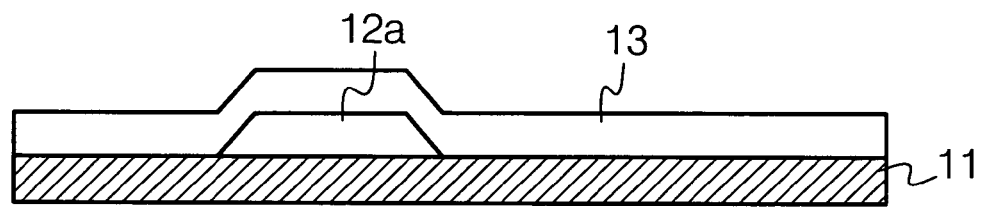
Figure 1C:
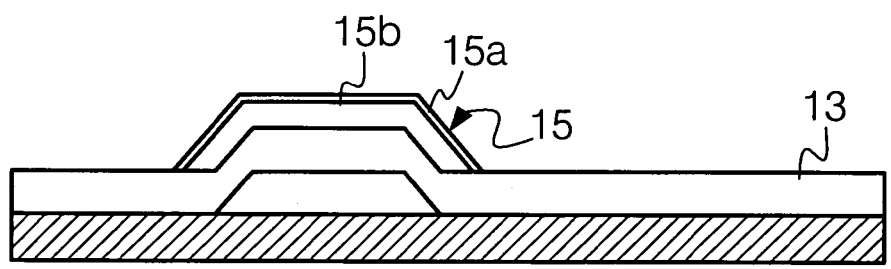
Figure 1D:
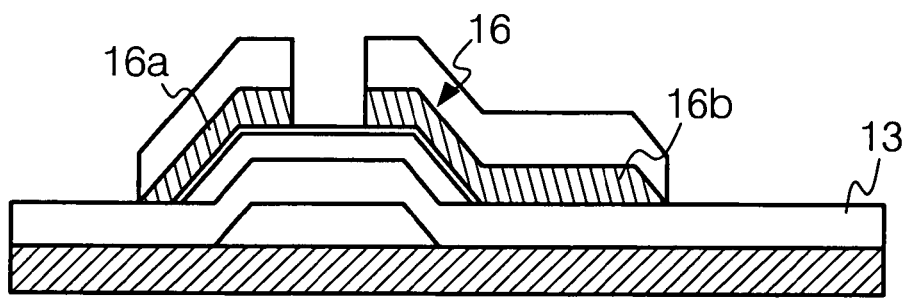
Figure 1E:
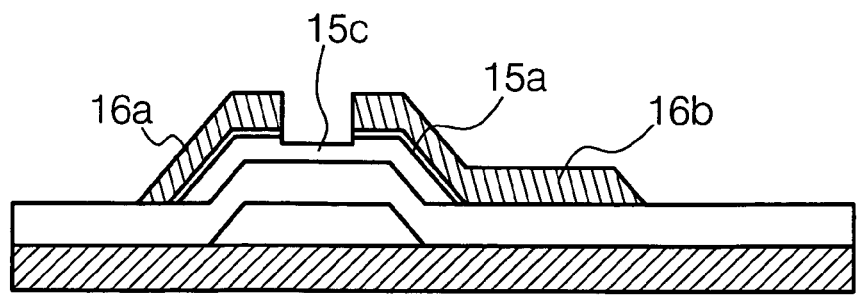
Figure 1F:
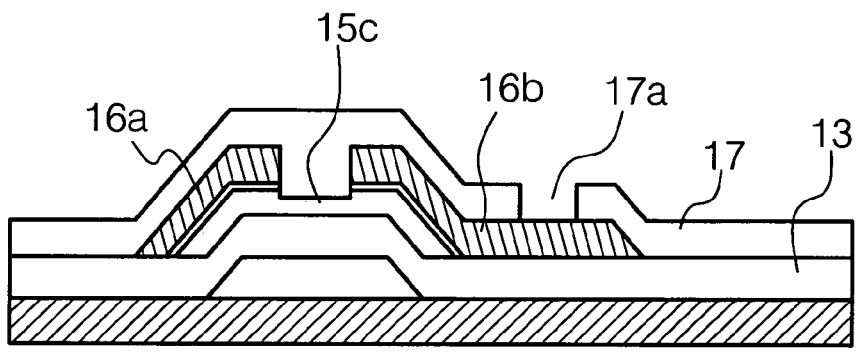
Figure 1G:
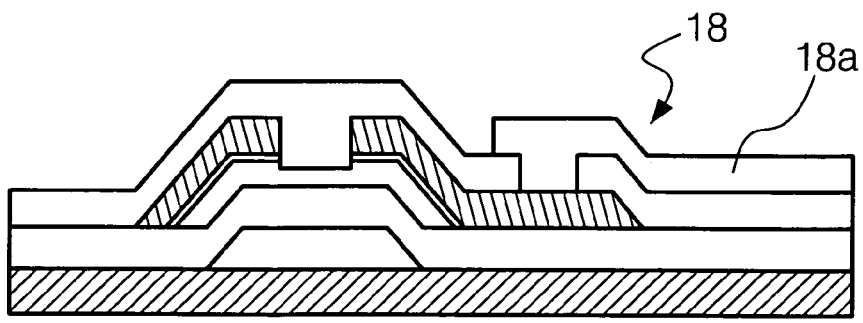
Figure 2:
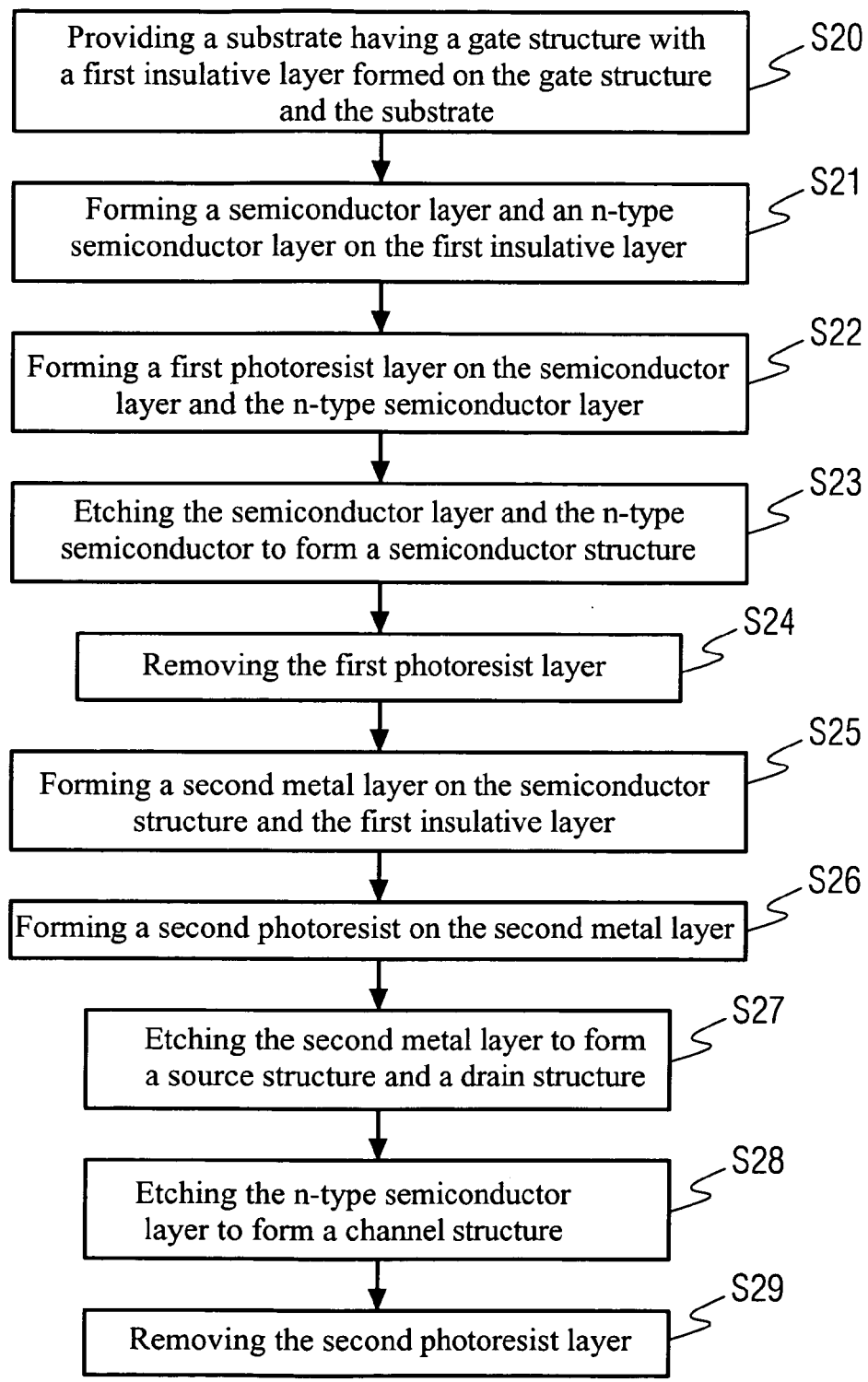
FIG. 2 shows a flowchart illustrating a conventional manufacturing method for the TFT structure shown in FIG. 1A to FIG. 1G.
Figure 3A:
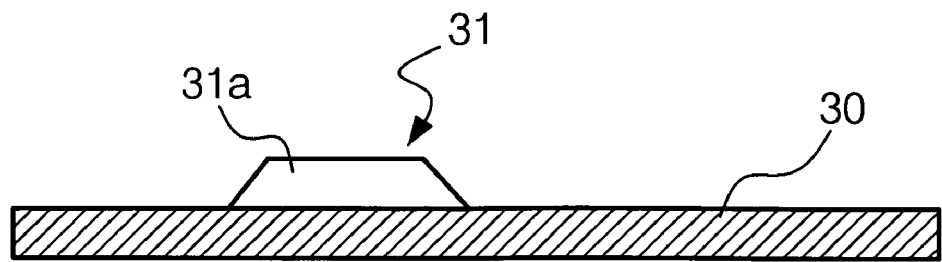
FIG. 3A to FIG. 3H show sectional views of a TFT structure after each manufacturing step is performed, respectively, according to the present invention.
Figure 3B:
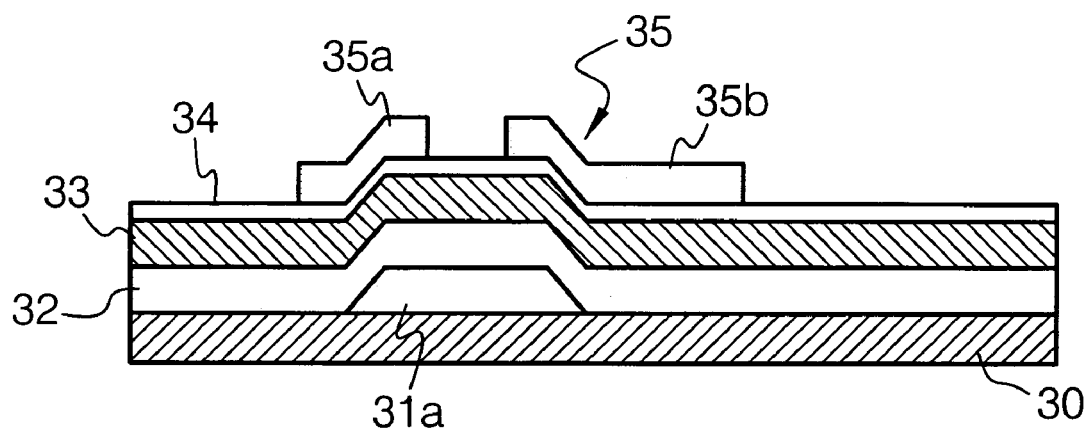
Figure 3C:
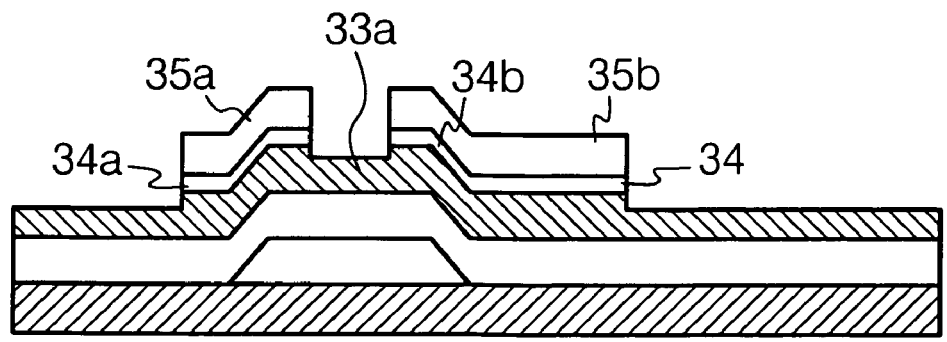
Figure 3D:
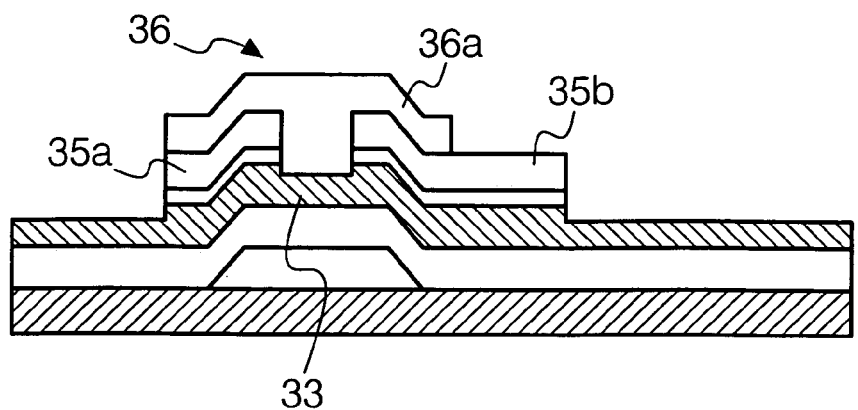
Figure 3E:
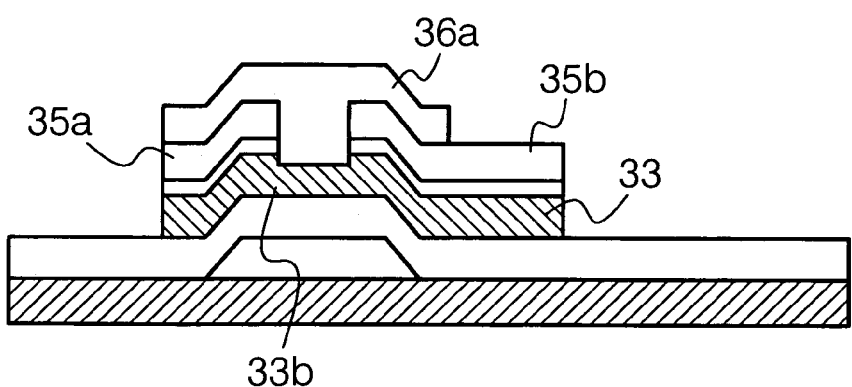
Figure 3F:
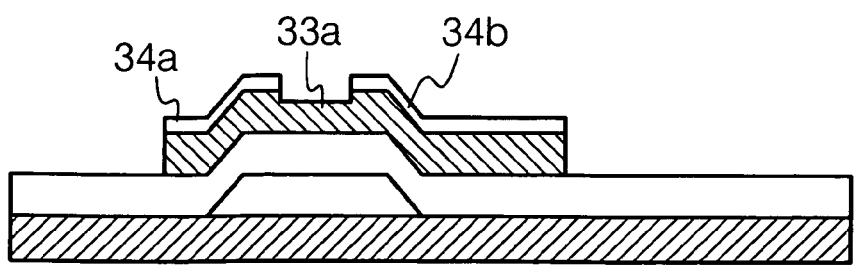
Figure 3G:
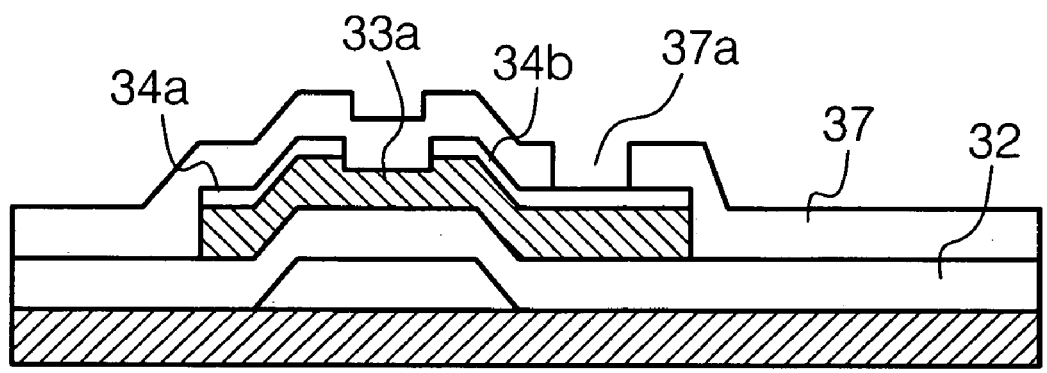
Figure 3H:
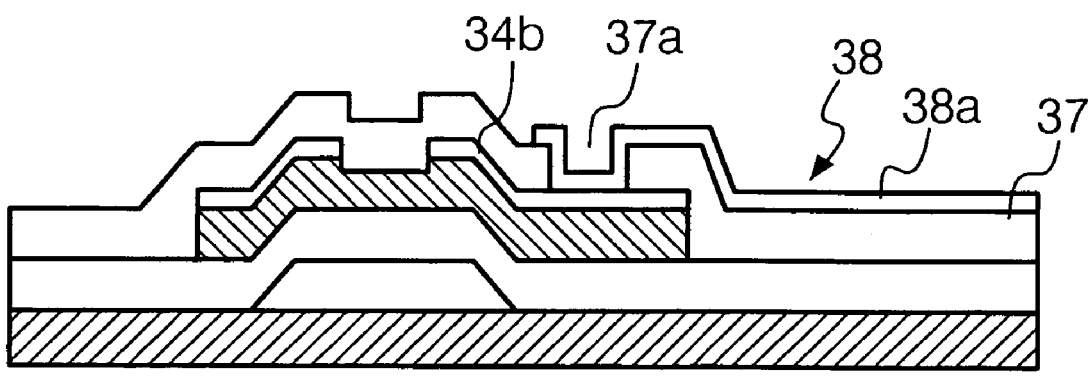

FIG. 3A to FIG. 3H show sectional views of a thin film transistor (TFT) structure after each manufacturing step is formed, respectively, according to the present invention. Referring first to FIG. 3A, a substrate 30 is first provided, which may be a glass substrate. Next, a metal layer 31 is formed on the substrate 30. The metal layer 31 may be formed of aluminum (Al), copper (Cu), wolfram (W), chromium (Cr) and other metals or a metallic alloy thereof by sputtering. Then, a gate structure 31a is defined on the metal layer 31 by using a first photomask (not shown) and subsequently formed through an etching process on the metal layer 31. Referring to FIG. 3B, a first insulative layer 32 and a semiconductor layer 33 are formed on the gate structure 31a and the substrate 30. The first insulative layer 32 may be made of silicon nitride (SiNx) and Silicon Oxide (SiOx) and the semiconductor layer 33 may be made of amorphous silicon (a-Si). Next, an ohmic contact layer 34 is formed on the semiconductor layer 33 and will be used to replace source/drain metal layer. The ohmic contact layer 34 may be formed by several methods. For instance, a doping process may be used to form an n-type semiconductor layer 33 on a surface of the semiconductor layer 33 so as to enhance the conductivity thereof. Alternatively, the ohmic contact layer 34 may be a poly silicon (P—Si) layer, which may be obtained by excimer laser annealing (ELA) the a-Si to become P—Si. Further, the ohmic contact layer 34 may also be an organic metallic compound layer. For instance, tungsten hexacarbonyl (W(CO)6) may be formed on the semiconductor layer 33 in situ after the semiconductor layer 33 is formed by chemical vapor deposition (CVD) technology. Thereafter, a first photoresist layer 35 is formed on the semiconductor layer 33. And a second photomask (not shown) is used to form a first photoresist structure 35a and a second photoresist structure 35b on the first photoresist layer 35. Referring to FIG. 3C, a portion of the ohmic contact layer 34 other than where the first and second photoresist structures 35a, 35b are located is etched through a dry etching process. Further, the semiconductor layer 33 is also etched for a specific thickness. In this manner, a source structure 34a and a drain structure 34b is formed on the ohmic contact layer 34 and a channel structure 33a is formed on the semiconductor layer 33. Referring to FIG. 3D, a second photoresist layer 36 is formed on the first and second photoresist structures 35a, 35b and the semiconductor layer 33. Further, a third photomask (not shown) is used to form a third photoresist structure 36a on the second photoresist layer 36. Referring to FIG. 3E, a portion of the semiconductor layer 33 other than where the first, second and third photoresist structures 35a, 35b, 36a are etched so as to form a semiconductor structure 33b on the semiconductor layer 33. Referring to FIG. 3F, the first and second photoresist layers 35, 36 are removed to expose the source and drain structures 34a, 34b and the channel structure 33a. Referring to FIG. 3G, a second insulative layer 37 is formed on the source and drain structures 34a, 34b, the channel structure 33a and the first insulative layer 32. The second insulative layer 37 may be made of SiNx and SiOx. Thereafter, a fourth photomask (not shown) is used to form a contact window structure 37a on the second insulative layer 37. The contact window structure 37a is located on the drain structure 34b. Referring to FIG. 3H, a transparent conducting layer 38 is formed on the drain structure 34b and the second insulative layer 37. The transparent conducting layer 38 may be formed of indium tin oxide (ITO) or indium zinc oxide (IZO) by sputtering. Thereafter, a fifth photomask (not shown) is used to define a pixel electrode structure 38a and the transparent conducting layer 38 is etched to form the pixel electrode structure 38a. The pixel electrode structure 38a may be connected electrically to the drain structure 34b through the contact window structure 37a.

Figure 4:
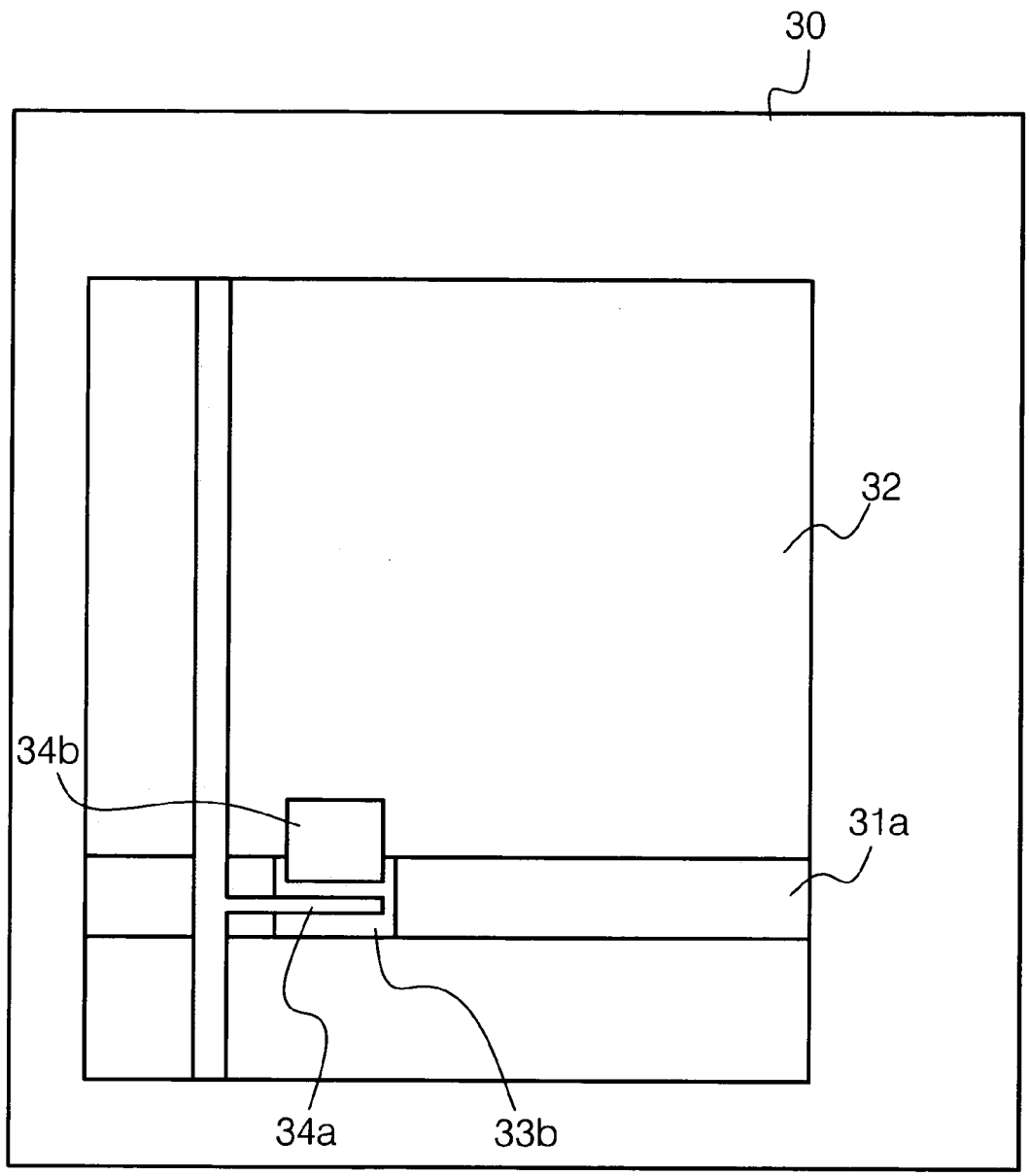
FIG. 4 is a structural diagram of the TFT structure according to the present invention.

Referring to FIG. 4, the TFT structure according to the present invention is shown therein. A substrate 30 is provided and a gate structure 31a, a first insulative layer 32, a semiconductor structure 33b, a source structure 34a and a drain structure 34b are formed thereon. The substrate 30 may be a glass substrate 30. The gate structure 31a may be formed of Al, Cu, W, Cr and other metals or a metallic alloy thereof on the substrate 30 by sputtering. The first insulative layer 32 may be formed of SiNx or SiOx on the gate structure 31a and the substrate 30. The semiconductor structure 33b may be formed of a-Si on the first insulative layer 32. The source and drain structures 34a, 34b may be formed of n-type a-Si, a P—Si or an organic compound on the semiconductor structure 33b.

Figure 5:
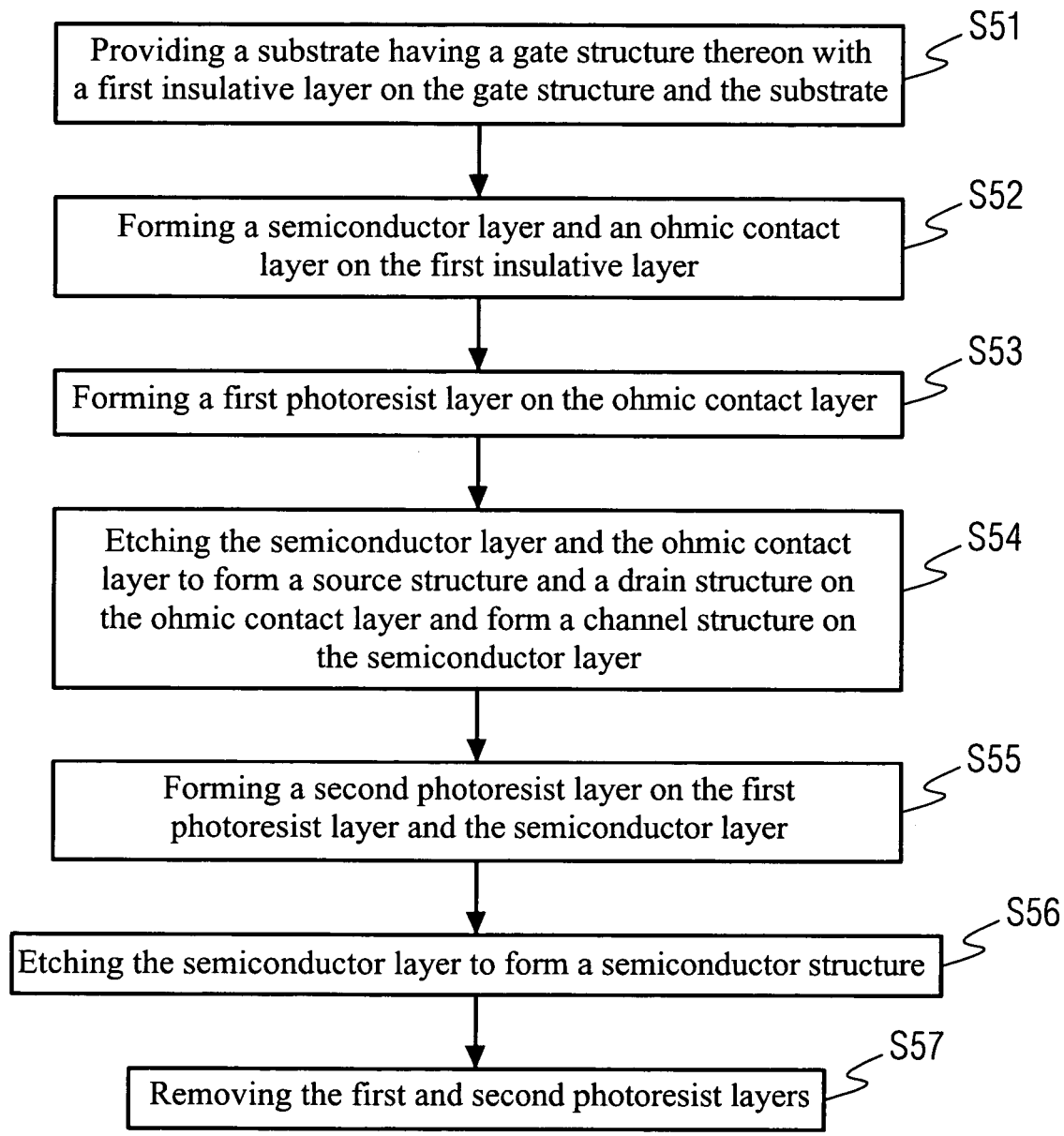
FIG. 5 is a flowchart illustrating a manufacturing method for the TFT structure according to the present invention.

Referring to FIG. 5, a flowchart illustrating a manufacturing method for a TFT according to the present invention is shown therein. At first, providing a substrate having a gate structure thereon with a first insulative layer on the gate structure and the substrate (S51). The substrate may be a glass substrate. The gate structure may be made of Al, Cu, W, Cr and other metals or a metallic alloy thereof. The first insulative layer may be made of SiNx and SiNx. Next, forming a semiconductor layer and an ohmic contact layer on the first insulative layer (S52). The semiconductor layer may be made of a-Si. The ohmic contact layer may be made of an n-type semiconductor. Then, forming a first photoresist layer on the ohmic contact layer (S53). Thereafter, etching the semiconductor layer and the ohmic contact layer to form a source structure and a drain structure on the ohmic contact layer and form a channel structure on the semiconductor layer (S54). The etching process may be a dry etching method. Thereafter, forming a second photoresist layer on the first photoresist layer and the semiconductor layer (S55). Then, etching the semiconductor layer to form a semiconductor structure (S56). Likewise, the etching process may be a dry etching method. Finally, removing the first and second photoresist layers (S57).

As compared to the conventional manufacturing method described above, the steps of removing the first photoresist layer (S24), forming a second metal layer on the semiconductor layer and the first insulative layer (S25) and etching the second metal layer and forming a source structure and a drain structure (S27) are omitted in the manufacturing method of this invention.

As above described, the first photoresist layer is not removed after the source and drain structures and the channel structure are formed and a second photoresist layer is directly formed on the first photoresist layer through the semiconductor layer is thus formed. Further, an n-type amorphous silicon (a-Si), P—Si or organic metallic compound is used in replace of the conventional metal to form the source and drain structures. As such, it is possible to reduce step number of manufacturing for a TFT, improve yield of the array manufacturing and thus lower cost for the LCD manufacturing.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A manufacturing method for a thin film transistor (TFT), comprising the steps of:
   providing a substrate having a gate structure thereon with a first insulative layer on said gate structure and said substrate;
   forming a semiconductor layer and an ohmic contact layer on said first insulative layer, wherein the ohmic contact layer is made of an n-type semiconductor;
   forming a first photoresist layer directly contacting said ohmic contact layer;
   etching said semiconductor layer and said ohmic contact layer to form a source structure and a drain structure in said ohmic contact layer and form a channel structure in said semiconductor layer;
   forming a second photoresist layer on said first photoresist layer and said semiconductor layer;
   etching said semiconductor layer to form a semiconductor structure on said semiconductor layer; and
   removing said first and second photoresist layers.

2. The manufacturing method according to claim 1, wherein said gate structure is made of a material selected from a group consisting of aluminum (Al), copper (Cu), wolfram (W), chromium (Cr), and other metals or a metallic alloy thereof.

3. The manufacturing method according to claim 1, wherein said first insulative layer is made of silicon nitride (SiNx) or silicon oxide (SiNx).

4. The manufacturing method according to claim 1, wherein said semiconductor is made of silicon.

5. The manufacturing method according to claim 1, further comprising a step of forming a second insulative layer on said source and drain structures, said channel structure, and said first insulative layer.

6. The manufacturing method according to claim 1, wherein said step of etching said semiconductor layer and said ohmic contact layer uses a dry etching method.

7. The manufacturing method according to claim 5, wherein said second insulative layer is made of SiNx or SiOx.

8. The manufacturing method according to claim 5, further comprising a step of forming a contact window structure on said second insulative layer.

9. The manufacturing method according to claim 8, further comprising a step of forming a transparent conducting layer on said drain structure and said second insulative layer.

10. The manufacturing method according to claim 9, wherein said transparent conducting layer is made of indium tin oxide or indium zinc oxide.

11. The manufacturing method according to claim 9, further comprising a step of forming a pixel electrode structure on said transparent conducting layer.

12. A manufacturing method for a thin film transistor (TFT), comprising the steps of:
   providing a substrate having a gate structure thereon with a first insulative layer on said gate structure and said substrate;
   forming a semiconductor layer and an ohmic contact layer on said first insulative layer, wherein the ohmic contact layer is a poly silicon;
   forming a first photoresist layer directly contacting said ohmic contact layer;
   etching said semiconductor layer and said ohmic contact layer to form a source structure and a drain structure in said ohmic contact layer and form a channel structure in said semiconductor layer;
   forming a second photoresist layer on said first photoresist layer and said semiconductor layer;
   etching said semiconductor layer to form a semiconductor structure on said semiconductor layer; and
   removing said first and second photoresist layers.

13. A manufacturing method for a thin film transistor (TFT), comprising the steps of:
   providing a substrate having a gate structure thereon with a first insulative layer on said gate structure and said substrate;
   forming a semiconductor layer and an ohmic contact layer on said first insulative layer, wherein the ohmic contact layer is an organic compound;
   forming a first photoresist layer directly contacting said ohmic contact layer;
   etching said semiconductor layer and said ohmic contact layer to form a source structure and a drain structure in said ohmic contact layer and form a channel structure in said semiconductor layer;
   forming a second photoresist layer on said first photoresist layer and said semiconductor layer;
   etching said semiconductor layer to form a semiconductor structure on said semiconductor layer; and
   removing said first and second photoresist layers.

* * * * *